(12) United States Patent
Suh

(10) Patent No.: US 7,578,966 B2
(45) Date of Patent: Aug. 25, 2009

(54) SOLDERS WITH INTERMETALLIC PHASES, SOLDER BUMPS MADE THEREOF, PACKAGES CONTAINING SAME, AND METHODS OF ASSEMBLING PACKAGES THEREWITH

(75) Inventor: Daewoong Suh, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 516 days.

(21) Appl. No.: 11/173,224

(22) Filed: Jun. 30, 2005

(65) Prior Publication Data

US 2007/0000967 A1  Jan. 4, 2007

(51) Int. Cl.
- B23K 35/22 (2006.01)
- B23K 35/24 (2006.01)
- B23K 35/26 (2006.01)
- B23K 35/28 (2006.01)
- C22C 28/00 (2006.01)

(52) U.S. Cl. .................................. 420/555
(58) Field of Classification Search ................ 420/555, 420/557–562; 257/772, E21.508
See application file for complete search history.

(56) References Cited

U.S. PATENT DOCUMENTS

| | | | |
|---|---|---|---|
| 5,891,756 A | 4/1999 | Erickson | |
| 6,162,652 A | 12/2000 | Dass et al. | |
| 6,417,089 B1 | 7/2002 | Kim et al. | |
| 6,521,996 B1 | 2/2003 | Seshan | |
| 6,569,262 B1 * | 5/2003 | Shohji | 148/24 |
| 6,818,545 B2 | 11/2004 | Lee et al. | |
| 6,853,076 B2 | 2/2005 | Datta et al. | |
| 7,217,645 B2 | 5/2007 | Yamashita et al. | |
| 7,253,088 B2 * | 8/2007 | Suh et al. | 438/612 |
| 7,314,819 B2 | 1/2008 | Hua et al. | |

* cited by examiner

Primary Examiner—George Wyszomierski
Assistant Examiner—Mark L. Shevin
(74) Attorney, Agent, or Firm—John N. Greaves; Intel Corporation

(57) ABSTRACT

A solder composition includes a reflow-wetting element that is an intermetallic both pre-reflow and post-reflow. The intermetallic releases the reflow-wetting element upon heating. The solder composition includes the intermetallic first phase in a bulk-solder second phase. A method of assembling a microelectronic package includes the intermetallic in a solder. A computing system also includes the intermetallic first phase in the bulk-solder second phase.

5 Claims, 6 Drawing Sheets

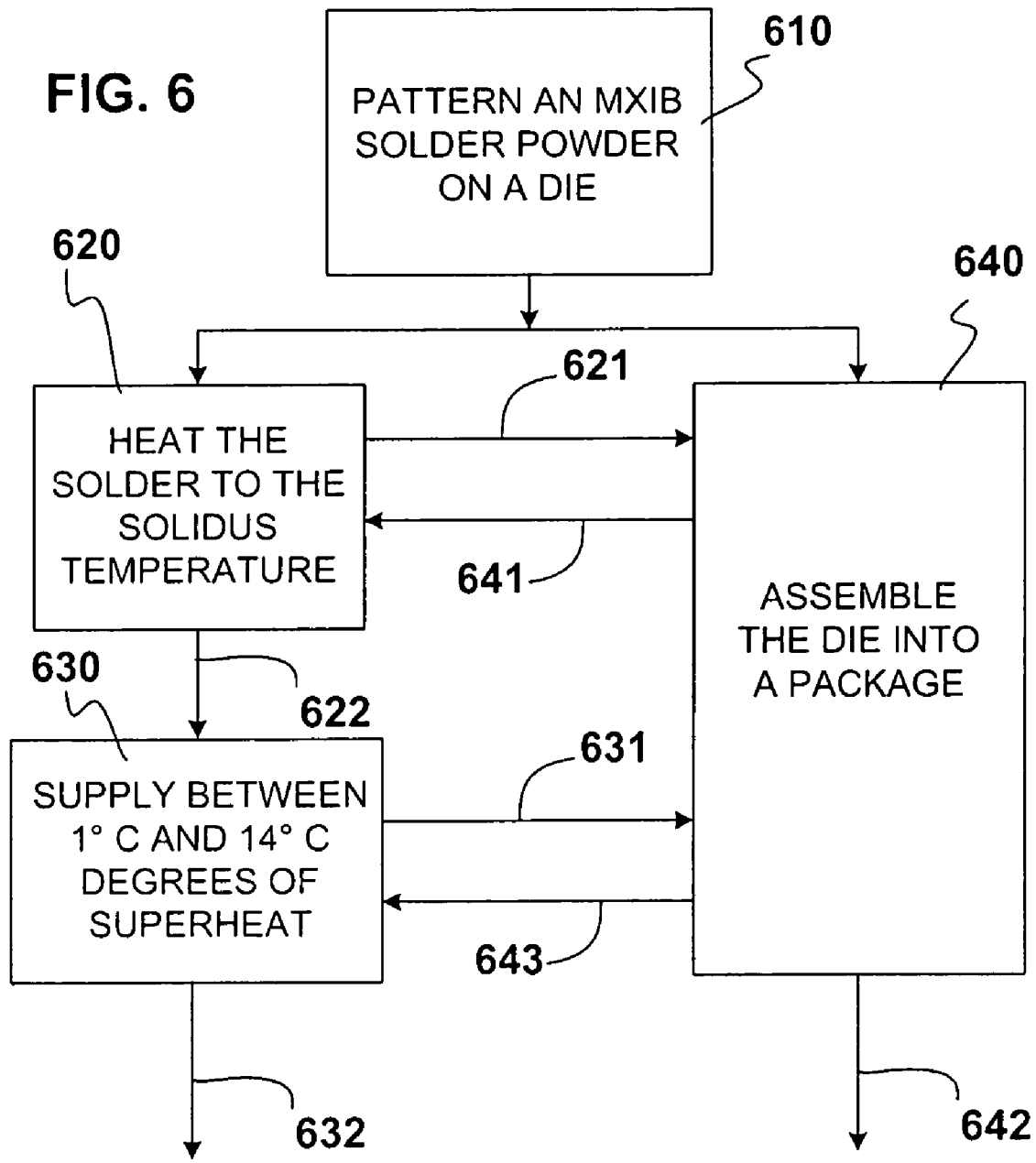

SOLDERS WITH INTERMETALLIC PHASES, SOLDER BUMPS MADE THEREOF, PACKAGES CONTAINING SAME, AND METHODS OF ASSEMBLING PACKAGES THEREWITH

TECHNICAL FIELD

Disclosed embodiments relate to a solder for use in a microelectronic device package.

BACKGROUND INFORMATION

An integrated circuit (IC) die is often fabricated into a processor for various tasks. The solder that is used to complete electronic connections between the IC die and the outside world often requires a significant amount of thermal budget to get the solder to reflow and to adhere properly for useful connections.

One problem that must be addressed in the connection of various different types of materials (i.e., microelectronic devices, substrates, heat slugs, etc.) is the coefficient of thermal expansion (CTE) for each material. The CTE is a measurement of the expansion and contraction of each material during heating and cooling cycles, respectively. These heating and cooling cycles occur during the operation of a microelectronic device and during power up and power down of the microelectronic device. Various materials can be selected to modify the problems with CTE mismatch, but processing temperatures are often higher than desirable.

BRIEF DESCRIPTION OF THE DRAWINGS

In order to understand the manner in which embodiments are obtained, a more particular description of various briefly described above will be rendered by reference to the appended drawings. Understanding that these drawings depict typical embodiments that are not necessarily drawn to scale and are not therefore to be considered to be limiting of its scope, some embodiments will be described and explained with additional specificity and detail through the use of the accompanying drawings in which:

FIG. 6 is a process flow diagram according to various embodiments; and

DETAILED DESCRIPTION

The following description includes terms, such as upper, lower, first, second, etc., that are used for descriptive purposes only and are not to be construed as limiting. The embodiments of a device or article described herein can be manufactured, used, or shipped in a number of positions and orientations. The terms "die" and "chip" generally refer to the physical object that is the basic workpiece that is transformed by various process operations into the desired integrated circuit device. A board is typically a resin-impregnated fiberglass structure that acts as a mounting substrate for the die. A die is usually singulated from a wafer, and wafers may be made of semiconducting, non-semiconducting, or combinations of semiconducting and non-semiconducting materials.

Reference will now be made to the drawings wherein like structures will be provided with like reference designations. In order to show the structure and process embodiments most clearly, the drawings included herein are diagrammatic representations of embodiments. Thus, the actual appearance of the fabricated structures, for example in a photomicrograph, may appear different while still incorporating the essential structures of embodiments. Moreover, the drawings show the structures necessary to understand the embodiments. Additional structures known in the art have not been included to maintain the clarity of the drawings.

Figure 1A:
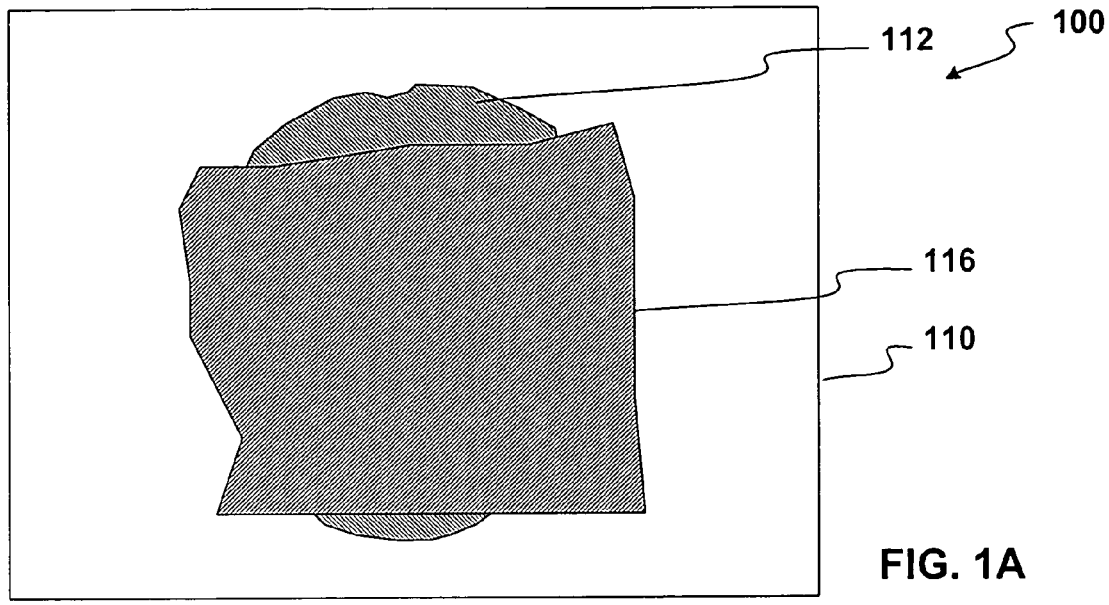
FIG. 1A is a computer-redrawn photomicrograph of an MX intermetallic-doped solder upon a test coupon according to an embodiment.

FIG. 1A is a computer-redrawn photomicrograph 100 of an MX intermetallic first phase, bulk second phase solder 116 upon a test coupon 110 according to an embodiment. The test coupon 110 is a substrate for a Cu bond pad 112. The MX intermetallic first phase, bulk second phase solder 116 includes an indium-bismuth (InBi) solder with a zinc content of about 0.2%.

In an embodiment, the MX intermetallic first phase, bulk second phase solder composition includes the M element with a redox potential of larger than about −0.5 Volt, and the MX intermetallic phase is present in a concentration from about 0.01% to about 1%, and the balance of the solder composition is the bulk solder second phase, with conventional impurity amounts for chip-packaging solders.

Figure 1B:
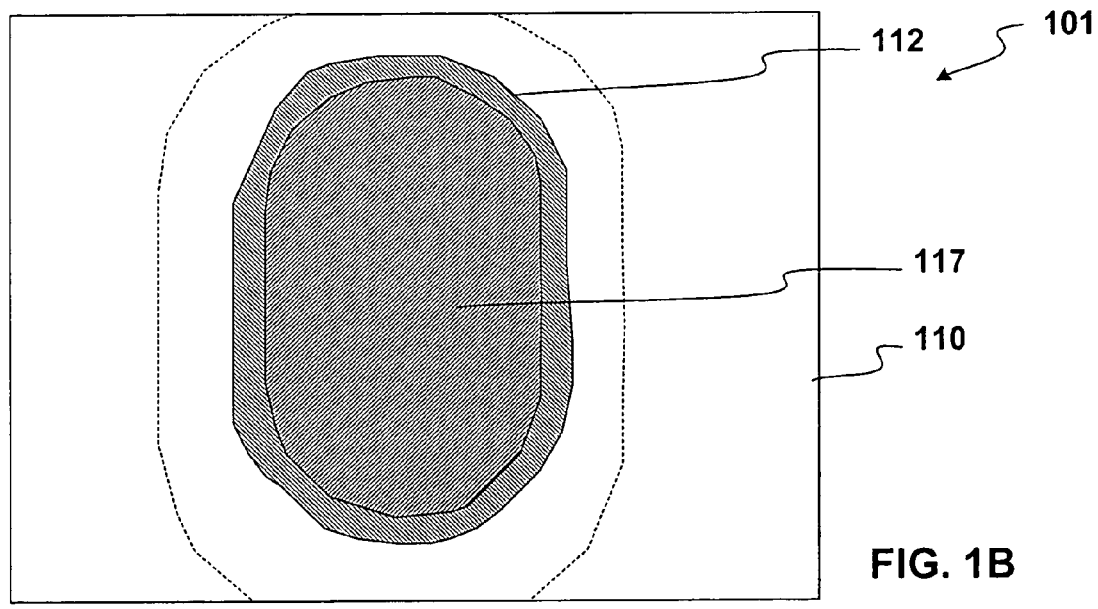
FIG. 1B is a computer-redrawn photomicrograph of the MX intermetallic-doped solder upon a test coupon depicted in FIG. 1A after processing according to an embodiment.

FIG. 1B is a computer-redrawn photomicrograph 101 of the MX intermetallic first phase, bulk second phase solder 116 upon the test coupon 110 depicted in FIG. 1A after processing according to an embodiment. Reflow was carried out at about 95° C., and the MX intermetallic first phase, bulk second phase solder 117 was subjected to superheating to about 110° C. Normally, an InBi solder will not wet Cu properly, if at all, and also will not properly wet, if at all, with about 15° C. of superheating to about 110° C. According to an embodiment, the solder 117 effectively wets the Cu bond pad 112 and accomplishes sufficient bonding at this low reflow temperature.

Figure 2:
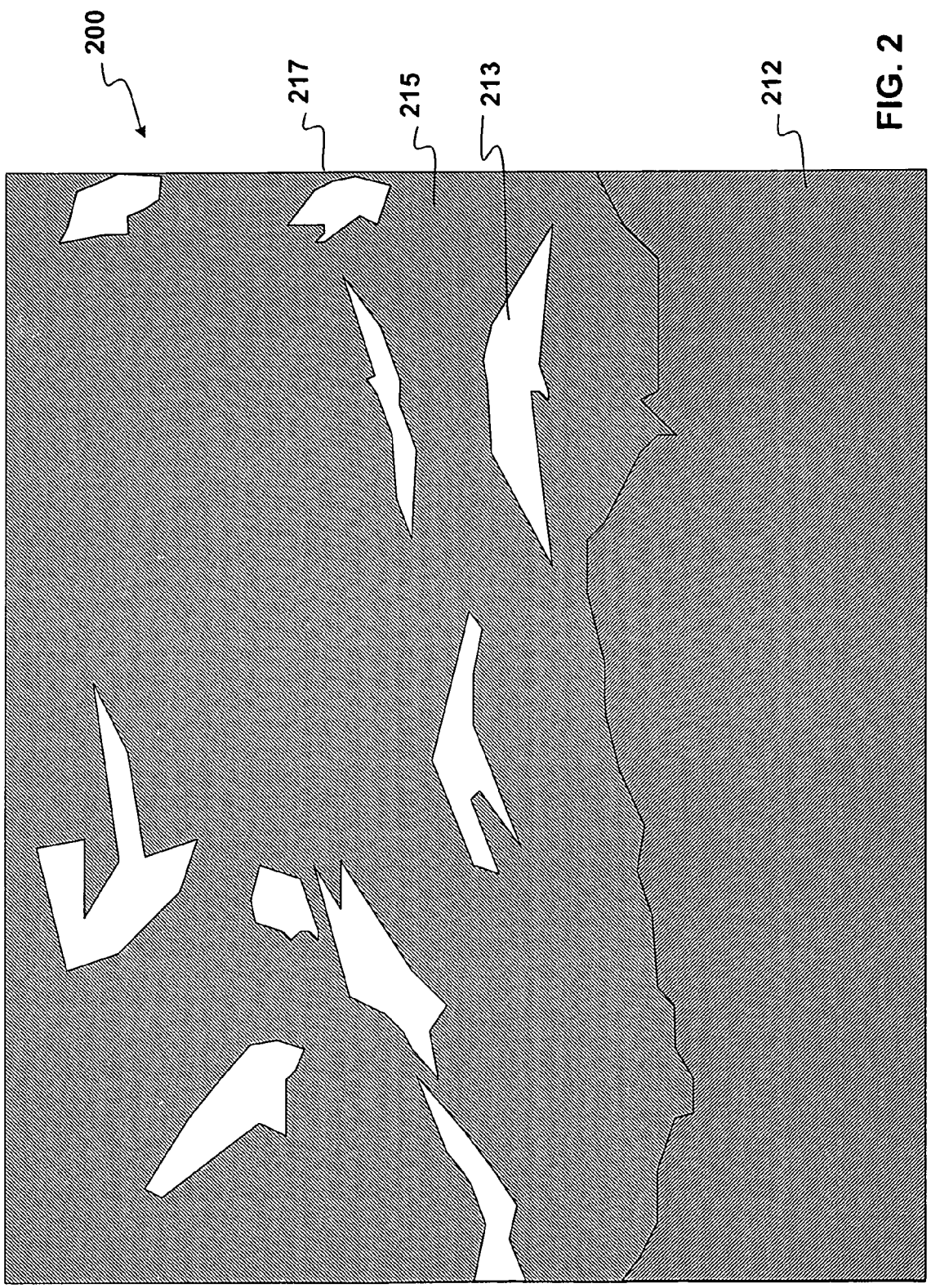
FIG. 2 is a cross-section elevation computer-redrawn photomicrograph of an MX intermetallic-doped solder bump after reflow according to an embodiment.

FIG. 2 is a cross-section elevation computer-redrawn photomicrograph 200 of an MX intermetallic first phase, bulk second phase solder bump 217 after reflow according to an embodiment. The MX intermetallic first phase 213, bulk second phase 215 solder bump 217 exhibits an interface that has formed between a bond pad 212, and the bulk solder second phase 215. In an embodiment, the MX intermetallic first phase 213, bulk second phase solder 217 is an InBiZn composition with less than about 1% Zn, which has come out of solution after cooling, but which caused enhanced wetting upon the bond pad 212 at a temperature range from about 95° C. to about 110° C.

In an embodiment, the intermetallic first phase 213 is described as MX, where M is a metal having a redox potential of larger than about −0.5 Volt (at 25° C., standard hydrogen electrode (SHE)). In an embodiment, the component X is a metal or alloy such as gold, nickel, or indium.

In an embodiment, along with the requirement of a redox potential of larger than about −0.5 Volt, the element M is a metal that can form an intermetallic compound at about 90° C. to about 130° C. with a second metal such as gold, nickel, or indium. Hereinafter, the redox potential shall be expressed with reference to the standard hydrogen electrode at 25° C. unless otherwise stated.

In an embodiment, along with the requirement of a redox potential of larger than about −0.5 Volt, the element M is a metal selected from Group IIIA of the Periodic Table, such as scandium, yttrium, as well as the corresponding lanthanide and actinide. In an embodiment, along with the requirement of a redox potential of larger than about −0.5 Volt, the element M is a metal selected from Group IVA of the Periodic Table, such as titanium, zirconium, or hafnium, as well as the corresponding rare-earth metal from the lanthanide and actinide series of rare-earth metals. In an embodiment, along with the requirement of a redox potential of larger than about −0.5 Volt (25° C., SHE), the element M is a metal selected from Group VA of the Periodic Table, such as vanadium, niobium, or tantalum, as well as the corresponding lanthanide. In an embodiment, along with the requirement of a redox potential of larger than about −0.5 Volt, the element M is a metal selected from Group VIA of the Periodic Table, such as chromium, molybdenum, or tungsten, as well as the corresponding lanthanide. In an embodiment, along with the requirement of a redox potential of larger than about −0.5 Volt, the element M is a metal selected from Group VIIA of the Periodic Table, such as manganese, technetium, or rhenium, as well as the corresponding lanthanide.

In an embodiment, along with the requirement of a redox potential of larger than about −0.5 Volt, the element M is a metal selected from Group VIII of the Periodic Table, such as iron, ruthenium, or osmium, as well as the corresponding lanthanide and actinide. In an embodiment, the Group VIII elements can include one of cobalt, rhodium, or iridium, as well as the corresponding lanthanide. In an embodiment, the Group VIII elements can include one of nickel, palladium, or platinum, as well as the corresponding lanthanide.

In an embodiment, along with the requirement of a redox potential of larger than about −0.5 Volt, the element M is a metal selected from Group IB of the Periodic Table, such as copper, silver, or gold, as well as the corresponding lanthanide. In an embodiment, along with the requirement of a redox potential of larger than about −0.5 Volt, the element M is a metal selected from Group IIB of the Periodic Table, such as zinc, cadmium, or mercury, as well as the corresponding lanthanide. In an embodiment, along with the requirement of a redox potential of larger than about −0.5 Volt, the element M is a metal selected from Group IIIB of the Periodic Table, such as aluminum, gallium, or indium, tellurium, as well as the corresponding lanthanide. In an embodiment, along with the requirement of a redox potential of larger than about −0.5 Volt, the element M is a metal selected from Group IVB of the Periodic Table, such as germanium, tin, lead, as well as the corresponding lanthanide. In an embodiment, along with the requirement of a redox potential of larger than about −0.5 Volt, the element M is a metal selected from Group VB of the Periodic Table, such as arsenic, antimony, bismuth, as well as the corresponding lanthanide.

In an embodiment, the stated redox potential range is not always necessary, so long as the element M has the ability to be liberated from the MX intermetallic in a temperature range from about 80° C. to about 150° C.

Figure 3A:
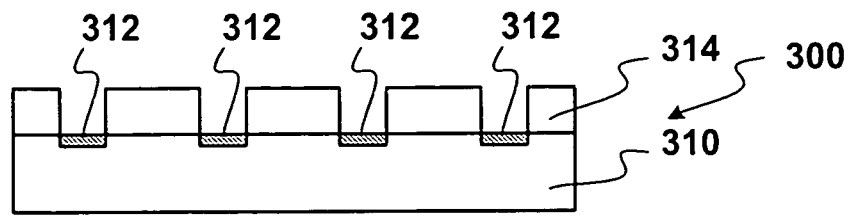
FIG. 3A is a cross section of a microelectronic device during processing according to an embodiment.

FIG. 3A is a cross section of a microelectronic device 300 during processing according to an embodiment. A substrate 310, such as one including a die, includes a bond pad 312 for electrical communication from the substrate 310 to the outside world. The microelectronic device 300 is depicted as being processed with a patterned mask 314 that exposes the bond pad 312. In an embodiment, the bond pad 312 is a copper upper metallization that can touch any one of several metallization layers. For example, a metallization such as metal one (M1, not pictured) in a simple microelectronic device makes electrical contact with the bond pad 312. In another example, a metallization such as metal two (M2, not pictured) makes electrical contact with the bond pad 312. The M2 makes electrical contact with the M1. This scheme can be continued up to and including M7 and higher if present. By this disclosure, it becomes clear that various semiconductor substrate structures are applicable to the various embodiments.

Figure 3B:
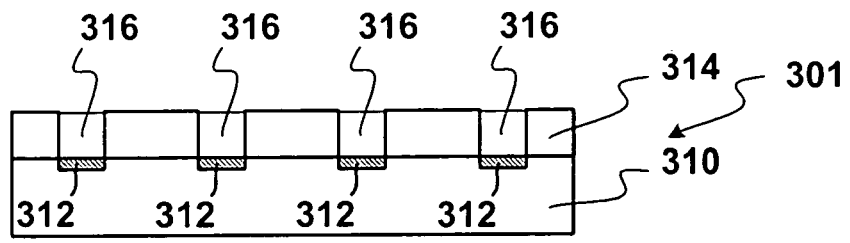
FIG. 3B is a cross section of the microelectronic device depicted in FIG. 3A after further processing.

FIG. 3B is a cross section of the microelectronic device 301 depicted in FIG. 3A after further processing. The patterned mask 314, which in an embodiment is a patterned photoresist, has been filled with a solder precursor such as an MX intermetallic first-phase component in a bulk solder second-phase component 316, also referred to as a solder paste 316, according to the various embodiments set forth in this disclosure.

In an embodiment, the solder paste 316 includes a flux vehicle such as an evaporative binder for the solder paste 316 during processing. In an embodiment, no patterning per se is done, rather, a fluxed solder powder is blanket formed, and during reflow, the flux vehicle fluidizes the MX intermetallic dissolves into the bulk second phase and the reflowing solder preferentially wets the bond pads 312 due to the tendency of the element M to be a metallic wetting agent.

Figure 3C:
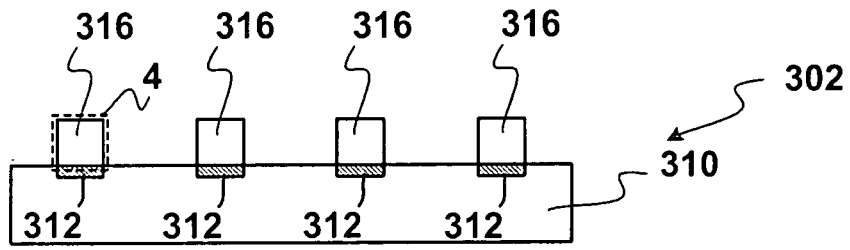
FIG. 3C is a cross section of the microelectronic device depicted in FIG. 3B after further processing.

FIG. 3C is a cross section of the microelectronic device 302 depicted in FIG. 3B after further processing. In this embodiment, the patterned mask 314 has been removed. Removal of the patterned mask 314 can be done by simply pulling it away from the substrate 310, and thereby leaving the fluxed solder powder 316 which is formed as discrete islands directly above the bond pads 312.

Figure 4:
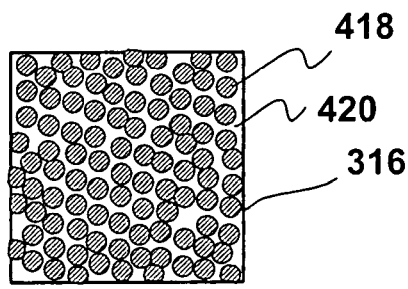
FIG. 4 is an enlargement of a portion of the microelectronic device depicted in FIG. 3C.

FIG. 4 is an enlargement of a portion of the microelectronic device depicted in FIG. 3C. FIG. 4 is taken from the area within the dashed line 4 depicted in FIG. 3C. FIG. 4 depicts the solder paste 316, which includes a solder precursor as a solder powder 418 within a flux matrix 420. The solder powder 418 includes the MX intermetallic first phase and the bulk solder second phase according to any of the solder composition embodiments set forth in this disclosure. Because the flux matrix 420 substantially protects the solder powder 418 from corrosive and/or oxidative influences, the solder powder 418 can remain substantially oxidation-resistant during reflow. In an embodiment, the solder powder 418 has a diameter in a range from about 4 microns to about 1,000 microns.

Figure 3D:
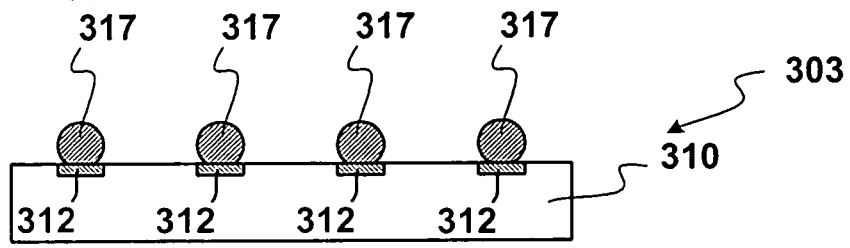
FIG. 3D is a cross section of the microelectronic device depicted in FIG. 3C after further processing.

FIG. 3D is a cross section of the microelectronic device 303 depicted in FIG. 3C after further processing. A reflow process has been commenced, during which the flux matrix 420 (FIG. 4) has been volatilized, and the solder powder 418 has reflowed into a solder bump 317 with a grain size and morphology similar to the structures depicted in FIGS. 1B and 2, among others. The reflow process depicted for the microelectronic device 303 can precede a method of assembling a microelectronic device package, it can be simultaneous to other heat treatments of a microelectronic device package, or it can follow some elements of assembling a microelectronic device package. These and other embodiments are discussed subsequently.

Figure 5A:
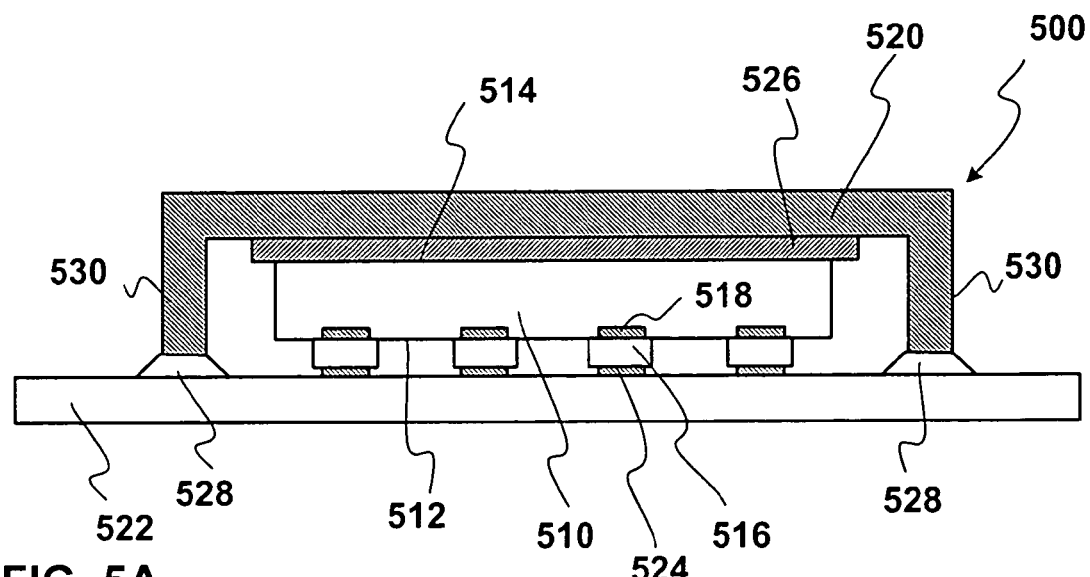
FIG. 5A is a cross section of a microelectronic device package according to an embodiment.

FIGS. 3C and 3D also represent system embodiments. In a system embodiment, the system includes a solder embodiment as an electrical connector that is in contact with two electrical conductors. In FIG. 3D, the solder bump 317 is the electrical connector. A first electrical conductor in an embodiment is the recessed bond pad 518 as depicted in FIG. 5A. A second electrical conductor in this embodiment is the mounting substrate bond pad 524. By review of embodiments in this disclosure, one can formulate claimed subject matter that includes a solder embodiment, a first electrical conductor, and a second electrical conductor.

In the following solder embodiments, solders were or are made from feedstocks of purities about or exceeding 99.8 intermetallic first phase, bulk second phase percent purity. In an embodiment, however, lower purity feedstocks can be used depending upon the conditions of a given application of the claimed subject matter. Alloy ingots were made by a vacuum arc melting technique. For example, a vacuum-sealed quartz tube can be used for production of solder ingots. After melting, the solders can be homogenized for a time range from about 1 hour to about 100 hours, in an embodiment for about 55 hours. The temperature during homogenization can be for a temperature range from about 90° C. to about 130°C., in an embodiment at about 95° C. Further processing can include a cold rolling operation to form a sheet. Other further processing can include extrusion to form wire. Yet other further processing can include powder compression for pelletizing.

In an embodiment, a prepared MX intermetallic first phase, bulk second phase solder powder is sufficiently segregated into two phases. Consequently, although the element M is useful to dissolve into the bulk second phase to achieve useful wetting upon a bond pad, it is sufficiently segregated as an intermetallic before use that it can exhibit a prolonged useful shelf life. In an embodiment, the prepared MX intermetallic first phase, bulk second phase solder powder has a useful shelf life in a range from about 1 week to about 9 years.

In an embodiment, a ZnAu MX intermetallic first phase is combined with a copper-doped, tin—indium-based bulk solder second phase. The bulk second phase is prepared with about 5 percent to about 15 percent indium and the ZnAu intermetallic first phase is less than 1% of the total solder compound. In an embodiment, a ZnNi MX intermetallic first phase is combined with a copper-doped, tin-indium-based bulk solder second phase and the ZnNi intermetallic first phase is less than 1% of the total solder compound. The bulk second phase is prepared with about 5 percent to about 15 percent indium. In an embodiment, the intermetallic first phase is a ZnAg compound that is used in the copper-doped, tin-indium-based bulk solder second phase.

In an embodiment, a ZnAu MX intermetallic first phase is combined with a copper—gallium-doped, tin—indium-based bulk solder second phase. The bulk second phase is prepared that contains from about 5 percent to about 15 percent indium and the ZnAu intermetallic first phase is less than 1% of the total solder compound. Copper-gallium doping is done in a 1:1 ratio with a copper-gallium doping concentration from about 0.01 percent to about 3 percent. In an embodiment, a ZnNi MX intermetallic first phase is combined with a copper—gallium-doped, tin—indium-based bulk solder second phase. The bulk second phase is prepared that contains from about 5 percent to about 15 percent indium and the ZnNi intermetallic first phase is less than 1% of the total solder compound. Copper—gallium doping is done in a 1:1 ratio with a copper—gallium doping concentration from about 0.01 percent to about 3 percent. In an embodiment, the intermetallic first phase is a ZnAg compound that is used in the copper—gallium-doped, tin—indium-based bulk solder second phase.

In an embodiment, a ZnAu MX intermetallic first phase is combined with a Sn-(7-10)In-(0.2-2)Sb bulk solder second phase and the ZnAu intermetallic first phase is less than 1% of the total solder compound. In an embodiment, a ZnNi MX intermetallic first phase is combined with a Sn-(7-10)In-(0.2-2)Sb bulk solder second phase and the ZnNi intermetallic first phase is less than 1% of the total solder compound. In an embodiment, the intermetallic first phase is a ZnAg compound that is used in the Sn-(7-10)In-(0.2-2)Sb bulk solder second phase. In an embodiment, the intermetallic first phase is a ZnAg compound that is used in the Sn-(7-10)In-(0.2-2)Sb bulk solder second phase.

In an embodiment, a ZnAu MX intermetallic first phase is combined with a silver-doped, tin-indium-based bulk solder second phase. The bulk solder second phase is prepared with about 5 percent to about 15 percent indium and the ZnAu intermetallic first phase is less than 1% of the total solder compound. Silver doping is done in a range from about 0.01 percent to about 3 percent. In an embodiment, a ZnNi MX intermetallic first phase is combined with a silver-doped, tin-indium-based bulk solder second phase. The bulk solder second phase is prepared with about 5 percent to about 15 percent indium and the ZnNi intermetallic first phase is less than 1% of the total solder compound. Silver doping is done in a range from about 0.01 percent to about 3 percent.

In an embodiment, a ZnAu MX intermetallic first phase is combined with a nickel-doped, tin-indium-based bulk solder second phase. The bulk solder second phase is prepared with about 5 percent to about 15 percent indium and the ZnAu intermetallic first phase is less than 1% of the total solder compound. Nickel doping is done in a range from about 0.01 percent to about 3 percent. In an embodiment, a ZnAg MX intermetallic first phase is combined with a nickel-doped, tin—indium-based bulk solder second phase. The bulk solder second phase is prepared with about 5 percent to about 15 percent indium and the ZnAg intermetallic first phase is less than 1% of the total solder compound. Nickel doping in the bulk second phase is done in a range from about 0.01 percent to about 3 percent.

In an embodiment, a ZnAu MX intermetallic first phase is combined with a germanium-doped, tin—indium-based bulk solder second phase. The bulk solder second phase is prepared with about 5 percent to about 15 percent indium and the ZnAu intermetallic first phase is less than 1% of the total solder compound. Germanium doping is done in a range from about 0.01 percent to about 3 percent. In an embodiment, the intermetallic first phase is a ZnNi compound that is used in the germanium-doped, tin-indium-based bulk solder second phase. In an embodiment, the intermetallic first phase is a ZnAg compound that is used in the germanium-doped, tin—indium-based bulk solder second phase. In an embodiment, the intermetallic first phase is a ZnCu compound that is used in the germanium-doped, tin—indium-based bulk solder second phase.

In an embodiment, a ZnAu MX intermetallic first phase is combined with a zinc-doped, tin—indium-based bulk solder second phase. The bulk solder second phase is prepared that contains from about 5 percent to about 15 percent indium and the ZnAu intermetallic first phase is less than 1% of the total solder compound. Zinc doping is done in a range from about 0.01 percent to about 3 percent. In an embodiment, a ZnNi MX intermetallic first phase is combined with a zinc-doped, tin-indium-based bulk solder second phase. The bulk solder second phase is prepared that contains from about 5 percent to about 15 percent indium and the ZnNi intermetallic first phase is less than 1% of the total solder compound. Zinc doping is done in a range from about 0.01 percent to about 3 percent.

In an embodiment, a ZnAu MX intermetallic first phase is combined with an aluminum-doped, tin-indium-based bulk solder second phase. The bulk solder second phase is prepared that contains from about 5 percent to about 15 percent indium and the ZnAu intermetallic first phase is less than 1% of the total solder compound. Aluminum doping is done in a range from about 0.01 percent to about 3 percent. In an embodiment, a ZnNi MX intermetallic first phase is combined with an aluminum-doped, tin—indium-based bulk solder second phase. The bulk solder second phase is prepared that contains from about 5 percent to about 15 percent indium and the ZnNi intermetallic first phase is less than 1% of the total solder compound. Aluminum doping is done in a range from about 0.01 percent to about 3 percent.

FIG. 5A is a cross section of a microelectronic device package 500 according to an embodiment. The microelectronic device package 500 includes a die 510 including an active surface 512 and a backside surface 514. In an embodiment, an MX intermetallic first phase, bulk second phase solder powder 516 is provided on the active surface 512. A recessed bond pad 518 is disposed upon the active surface 512 and makes contact with the solder powder 516. In an embodiment, the die 510 is disposed between an integrated heat spreader (IHS) 520 and a mounting substrate 522. The solder powder 516 is disposed on a mounting substrate bond pad 524. The solder powder 516 makes contact with the active surface 512 of the die 510.

The mounting substrate 522 can be any mounting substrate known in the art, such as a printed circuit board (PCB), a main board, a motherboard, a mezzanine board, an expansion card, or another mounting substrate. In an embodiment, a thermal interface material (TIM) 526 is disposed between the backside surface 514 of the die 510 and the IHS 520. In an embodiment, the TIM 526 is a thermal grease. In an embodiment, the TIM 526 is an MX intermetallic first phase, bulk second phase solder as set forth in this disclosure. In an embodiment, the TIM 526 is a reactive solder that chemically bonds with the backside surface 514 during reflow processing. In an embodiment, the TIM 526 is a filled solder, such as a diamond-filled solder or a carbon fiber-filled solder.

In FIG. 5A, the IHS 520 is attached with a bonding material 528 that secures a lip portion 530 of the IHS 520 thereto. By reading this disclosure, one recognizes that variations of the microelectronic device package 500 can be adapted to use of one of the several solder embodiments.

Figure 5B:
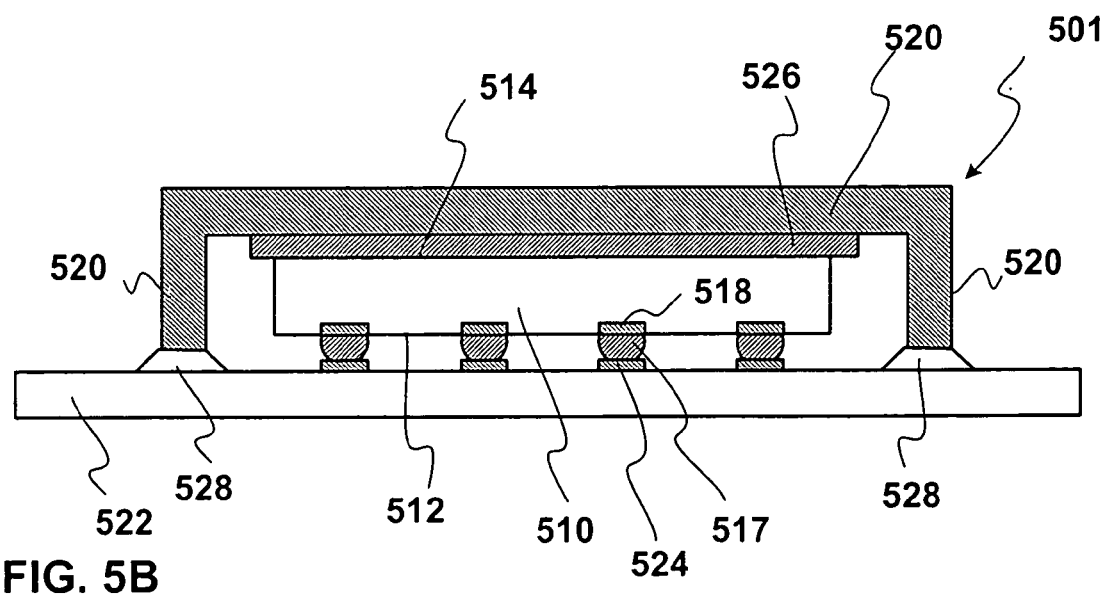
FIG. 5B is a cross section of the microelectronic device package depicted in FIG. 5A after further processing.

FIG. 5B is a cross section of the microelectronic device package 501 depicted in FIG. 5A after further processing. Reflow of the solder paste 516 (FIG. 5A) into a solder bump 517 and the TIM 526, or one of them in connection with the die 510, can be carried out by thermal processing. In an embodiment, heat is applied to a temperature that approaches or achieves the solidus temperature of the specific solder bump 517, followed by about 5-15° C. of superheating. In an embodiment, the solder bump 517 is heated to a range from about 95° C. to about 130° C. In an embodiment, the solder bump 517 is superheated to about 115° C. In an embodiment, the solder bump 517 is superheated to about 110° C.

FIG. 6 is a process flow diagram according to various embodiments. Processing of the MX intermetallic first phase, bulk second phase solder powder 316 (FIGS. 3B and 3C) or the solder powder 516 (FIG. 5A) is carried out during a process of forming a solder bump, and during a method of assembling a packaged die, respectively.

At 610, an MX intermetallic first phase, bulk second phase solder powder is patterned on a die. By way of illustration in FIG. 3B, a patterned mask 314 has been filled with a solder powder 316.

At 620, the MX intermetallic first phase, bulk second phase solder powder is reflowed into a solder bump on the die. By way of illustration in FIG. 3D and FIG. 5B, the respective reflowed solder bumps 317 and 517 are depicted as forming a solder bump. At 621, the process flow can proceed from the process of reflowing the MX intermetallic first phase, bulk second phase solder powder, to the method of assembling the die into a package. At 622, one process embodiment is completed.

At 630, the process includes supplying between 0.01° C. and about 15° C. of superheat to the MX intermetallic first phase, bulk second phase solder powder. The upper limit of superheat can be as high as 50° C. where either of the MX elements, or both, exhibit a greater degree of wetting upon copper or aluminum bond pads, and where such greater degree of wetting is useful for a given application. At 631, the process flow can proceed from the process of superheating the reflowed solder to the method of assembling the die into a package. At 632, one process embodiment is completed.

At 640, the die including the MX intermetallic first phase, bulk second phase solder or the MX intermetallic first phase, bulk second phase solder powder is assembled into a package. By way of illustration, FIGS. 5A and 5B depict the assembly of a die 510 with at least a mounting substrate 522. Optionally, an IHS 520 or other heat sink substrate is also assembled with the solder powder 516 or the solder bump 517 and the die 510. At 641, the process flow can proceed to assembling the die into a package, followed by the process of reflowing the MX intermetallic first phase, bulk second phase solder powder into an MX intermetallic first phase, bulk second phase solder bump. At 642, one method embodiment is completed.

Figure 7:
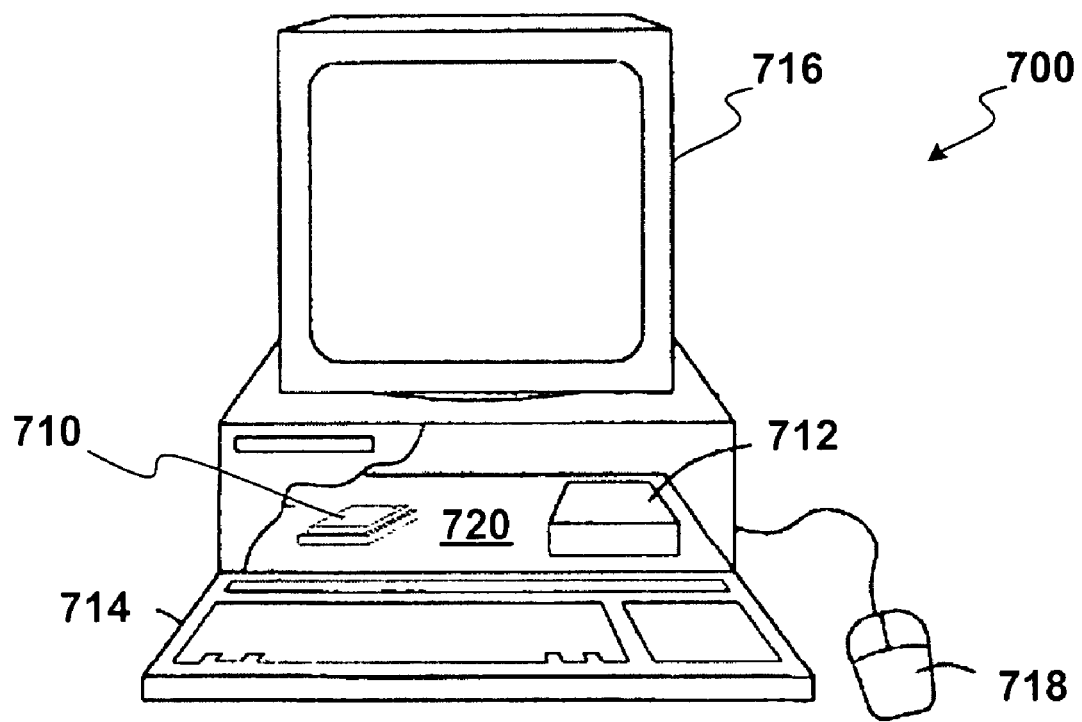
FIG. 7 is a depiction of a computing system according to an embodiment.

FIG. 7 is a depiction of a computer system 700 according to an embodiment. One or more of the foregoing embodiments of an MX intermetallic first phase, bulk second phase solder may be utilized in a computing system, such as a computing system 700 of FIG. 7. The computing system 700 includes at least one processor (not pictured), which is enclosed in a microelectronic device package 710, a data storage system 712, at least one input device such as keyboard 714, and at least one output device such as monitor 716, for example. The computing system 700 includes a processor that processes data signals, and may include, for example a microprocessor, available from Intel Corporation. In addition to the keyboard 714, the computing system 700 can include another user input device such as a mouse 718, for example.

For purposes of this disclosure, a computing system 700 embodying components in accordance with the claimed subject matter may include any system that utilizes an MX intermetallic first phase, bulk second phase solder in a package, which may be coupled to a mounting substrate 720. Embodiments include the MX intermetallic first phase, bulk second phase solder claimed subject matter in connection with any system that utilizes a microelectronic device package, which may include, for example, a data storage device such as dynamic random access memory, polymer memory, flash memory, and phase-change memory. The microelectronic device package can also include a die that contains a digital signal processor (DSP), a micro controller, an application specific integrated circuit (ASIC), or a microprocessor.

Embodiments set forth in this disclosure can be applied to devices and apparatuses other than a traditional computer. For example, a die can be packaged with an embodiment of the an MX intermetallic first phase, bulk second phase solder and placed in a portable device such as a wireless communicator or a hand-held device such as a personal data assistant and the like. Another example is a die that can be packaged with an embodiment of the an MX intermetallic first phase, bulk second phase solder and placed in a vehicle such as an automobile, a locomotive, a watercraft, an aircraft, or a spacecraft.

The Abstract is provided to comply with 37 C.F.R. § 1.72 (b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A solder composition comprising:
    a ZnX intermetallic first phase, wherein X is a metal selected from tin, gold, silver, copper, nickel, aluminum, and combinations thereof, and wherein the ZnX intermetallic phase is present in a concentration range from about 0.01% to about 1%; and
    the balance, a bulk solder second phase of InBiZn, and wherein Zn has the ability to be liberated from the ZnX intermetallic first phase in a temperature range from about 95° C. to about 110° C.

2. The solder composition of claim 1, wherein Zn has a redox potential of larger than about −0.5 Volt (at 25° C., standard hydrogen electrode).

3. A solder paste comprising:
    an organic matrix; and
    a solder including;
        a ZnX intermetallic first phase, wherein X is a metal selected from tin, gold, silver, copper, nickel, aluminum, and combinations thereof, and wherein the ZnX intermetallic phase is present in a concentration range from about 0.01% to about 1%; and
        the balance, a bulk solder second phase of InBiZn.

4. The solder paste of claim 3, wherein the solder paste has an effective reflow-wetting shelf life of about 2 years.

5. The solder paste of claim 3, wherein the organic matrix includes a flux vehicle.

* * * * *

UNITED STATES PATENT AND TRADEMARK OFFICE
CERTIFICATE OF CORRECTION

PATENT NO. : 7,578,966 B2  Page 1 of 1
APPLICATION NO. : 11/173224
DATED : August 25, 2009
INVENTOR(S) : Daewoong Suh It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 930 days.

Signed and Sealed this

Fourteenth Day of September, 2010

David J. Kappos
*Director of the United States Patent and Trademark Office*